(12) United States Patent
Bengtson

(10) Patent No.: US 7,545,865 B2
(45) Date of Patent: Jun. 9, 2009

(54) APPARATUS, METHODS AND ARTICLES OF MANUFACTURE FOR WIDEBAND SIGNAL PROCESSING

(75) Inventor: David Bengtson, Easton, PA (US)

(73) Assignee: M/A-Com, Inc., Lowell, MA (US)

( * ) Notice: Subject to any disclaimer, the term of this patent is extended or adjusted under 35 U.S.C. 154(b) by 741 days.

(21) Appl. No.: 10/308,593

(22) Filed: Dec. 3, 2002

(65) Prior Publication Data

US 2004/0105502 A1    Jun. 3, 2004

(51) Int. Cl.
*H04L 27/00* (2006.01)
(52) U.S. Cl. .................................................. 375/256
(58) Field of Classification Search ................. 375/256, 375/260, 261, 376, 373, 375, 294
See application file for complete search history.

(56) References Cited

U.S. PATENT DOCUMENTS

| | | | |
|---|---|---|---|
| 3,978,422 A | | 8/1976 | Rheinfelder |
| 4,580,111 A | | 4/1986 | Swanson |
| 4,586,000 A | | 4/1986 | Wagner |
| 4,646,359 A | | 2/1987 | Furrer |
| 4,965,531 A | * | 10/1990 | Riley .......................... 331/1 A |
| 5,038,117 A | * | 8/1991 | Miller .......................... 331/16 |
| 5,278,997 A | | 1/1994 | Martin |
| 5,311,143 A | | 5/1994 | Soliday |
| 5,410,280 A | | 4/1995 | Linguet et al. |
| 5,642,002 A | | 6/1997 | Mekanik et al. |
| 5,774,017 A | | 6/1998 | Adar |
| 5,818,298 A | | 10/1998 | Dent et al. |
| 5,880,633 A | | 3/1999 | Leizerovich et al. |
| 5,892,431 A | | 4/1999 | Osterman |
| 5,903,194 A | | 5/1999 | Opsahl et al. ................ 331/1 A |
| 5,930,128 A | | 7/1999 | Dent |
| 5,939,951 A | | 8/1999 | Bateman et al. |
| 5,942,946 A | | 8/1999 | Su et al. |
| 5,952,895 A | | 9/1999 | McCune, Jr. et al. |
| 6,002,273 A | * | 12/1999 | Humphreys .................... 327/3 |
| 6,043,707 A | | 3/2000 | Budnik |
| 6,043,712 A | | 3/2000 | Leizerovich et al. |
| 6,047,029 A | * | 4/2000 | Eriksson et al. ............. 375/247 |
| 6,075,413 A | | 6/2000 | Katakura |

(Continued)

FOREIGN PATENT DOCUMENTS

EP    1 235 403 A2    8/2002

(Continued)

OTHER PUBLICATIONS

Hulick, "The Digital Linear Amplifier", Schwenksville, Pennsylvania.

(Continued)

*Primary Examiner*—Chieh M Fan
*Assistant Examiner*—Jaison Joseph

(57) ABSTRACT

An apparatus for electromagnetic processing comprises a modulator for generating one or more elements representative of an input signal; a divider controlled by the one or more elements and receiving an electromagnetic wave to generate a modified signal; a comparator for comparing the modified signal to a reference signal and for generating a processed signal based upon the comparison; and a channel number calculator for selecting a channel for the processed signal, wherein the input signal incorporated the channel selection.

16 Claims, 4 Drawing Sheets

U.S. PATENT DOCUMENTS

| | | | |
|---|---|---|---|
| 6,078,628 A | 6/2000 | Griffith et al. | |
| 6,094,101 A | 7/2000 | Sander et al. | |
| 6,097,252 A | 8/2000 | Sigmon et al. | |
| 6,101,224 A | 8/2000 | Lindoff et al. | |
| 6,112,071 A | 8/2000 | McCune, Jr. | |
| 6,133,788 A | 10/2000 | Dent | |
| 6,140,875 A | 10/2000 | Van Den Homberg et al. | |
| 6,140,882 A | 10/2000 | Sander | |
| 6,147,553 A | 11/2000 | Kolanek | |
| 6,157,681 A | 12/2000 | Daniel et al. | |
| 6,191,653 B1 | 2/2001 | Camp, Jr. et al. | |
| 6,198,347 B1 | 3/2001 | Sander et al. | |
| 6,201,452 B1 | 3/2001 | Dent et al. | |
| 6,215,355 B1 | 4/2001 | Meck et al. | |
| 6,219,394 B1 | 4/2001 | Sander | |
| 6,236,284 B1 | 5/2001 | Duello et al. | |
| 6,242,975 B1 | 6/2001 | Eidson et al. | |
| 6,246,286 B1 | 6/2001 | Persson | |
| 6,255,906 B1 | 7/2001 | Eidson et al. | |
| 6,255,912 B1 | 7/2001 | Laub et al. | 331/25 |
| 6,259,901 B1 | 7/2001 | Shinomiya et al. | |
| 6,269,135 B1 | 7/2001 | Sander | |
| 6,285,251 B1 | 9/2001 | Dent et al. | |
| 6,288,916 B1 | 9/2001 | Liu et al. | |
| 6,294,957 B1 | 9/2001 | Luu | |
| 6,311,046 B1 | 10/2001 | Dent | |
| 6,317,608 B1 | 11/2001 | Glöcker | |
| 6,321,072 B1 | 11/2001 | Cipriani et al. | |
| 6,323,731 B1 | 11/2001 | McCune, Jr. | |
| 6,356,155 B1 | 3/2002 | Judkins | |
| 6,366,177 B1 | 4/2002 | McCune et al. | |
| 6,369,657 B2 | 4/2002 | Dening et al. | |
| 6,377,784 B2 | 4/2002 | McCune | |
| 6,380,802 B1 | 4/2002 | Pehike et al. | |
| 6,404,823 B1 | 6/2002 | Grange et al. | |
| 6,411,655 B1 | 6/2002 | Holden et al. | |
| 6,426,677 B1 | 7/2002 | Prentice | |
| 6,426,678 B1 | 7/2002 | Ko | |
| 6,430,402 B1 | 8/2002 | Agahi-Kesheh | |
| 6,445,247 B1 | 9/2002 | Walker | |
| 6,449,465 B1 | 9/2002 | Gailus et al. | |
| 6,927,716 B2 * | 8/2005 | Keaveney et al. | 341/143 |
| 6,985,703 B2 * | 1/2006 | Groe et al. | 455/108 |
| 2002/0067773 A1 | 6/2002 | Jackson et al. | 375/308 |
| 2002/0105389 A1 | 8/2002 | Nishimura et al. | 331/100 |
| 2003/0031267 A1 | 2/2003 | Hietala | 375/295 |

FOREIGN PATENT DOCUMENTS

| | | | |
|---|---|---|---|
| GB | 2 019 145 A | 10/1979 | |
| WO | WO 01/10013 A1 | 2/2001 | |

OTHER PUBLICATIONS

Kozyrey, "Single-Ended Switching-Mode Tuned Power Amplifier with Filtering Circuit", Poluprovodnikovye pribory v tekhnike svyazi; 1971, pp. 152-166, vol. 6.
TimeStar™, "Multi-Mode Polar Modulator" 2002, Tropian Headquarters, USA.
Sundstrom, "Digital RF Power Amplifier Linearisers", 1995, Sweden.
Kenington, "Linearised RF Amplifier and Transmitter Techniques", Microwave Engineering Europe, Nov. 1998, pp. 35.
Mann, et al., "Increasing Talk-Time with Effecient Linear PAs", Presented at IEE Colloquim on Tetra Market and Technology Developments, Feb. 2000, London.
Mann, et al., "Increasing the Talk-Time of Mobile Radios with Effecient Linear Transmitter Architectures", Electronics & Communication Engineering Journal, Apr. 2001, pp. 65-76, vol. 13, No. 2.
Heimbach, "Digital Multimode Technology Redefines the Nature of RF Transmission", Applied Microwave & Wireless, Aug. 2001.
Swanson, "Digital AM Transmitters", IEEE Transactions on Broadcasting, Jun. 1989, pp. 131-133, vol. 35, No. 2.
Tropian-Products Main, www.tropian.com/products/, Copyright 2000-2001, Aug. 14, 2002.
"Tropian and Agilent Technologies announce collaboration on multi-band, multi-mode 2.5G transmitter solutions", Feb. 18, 2002, Connes, France.
"Tropian Awarded 8th U.S. Patent for Wireless Technology: Innnovative RF Power Processing Circuit Architecture Achieves Speed and Accuracy in Polar Modulation," Aug. 6, 2001, Cupertino, California.
Dialog Web Command Mode, p. 1 of 1, Sep. 17, 2002, Record 03929207, Polar Modulators for 1 and 2 GHz Power Amplifier Correction, Nisbet, J.
Dialog Web Command Mode, p. 1 of 1, Sep. 17, 2002, Record 0326082, A new Class-AB Design, De Jager, et al., Electronics World 105, Dec. 1999, p. 982-7.
Dialog Web Command Mode, p. 1 of 1, Sep. 17, 2002, Record 2371235, Increasing the talk-time of mobile radios with efficient linear transmitter architectures, Mann et al., Electronics & Communication Engineering Journal, v. 13, No. 2, Apr. 2001 (p. 65-76).
Dialog Web Command Mode, p. 1 of 3, Sep. 17, 2002, Record 15595216, The big climate amplifier ocean circulation-sea-ice-storminess-dustiness-albedo, Broecker, Geophysical Monograph, 2001, 126, 53-56, etc.
Dialog Web Command Mode, p. 1 of 9, Sep. 19, 2002, Record 10872787, Out-of-band emissions of digital transmissions using Kahn EER technique, Rudolph, IEEE Transactions on Microwave Theory & Techniques, 2002, V 50, N 8, Aug, p. 1979-1983, etc.
Dialog Web Command Mode, p. 1 of 20, Sep. 17, 2002. Record 01239474, GSM players Eye Edge Despite Transmit Woes, Keenan, Electronic Engineering Times, 2002, n 1211, p. 6.

* cited by examiner

APPARATUS, METHODS AND ARTICLES OF MANUFACTURE FOR WIDEBAND SIGNAL PROCESSING

FIELD OF THE INVENTION

The present invention relates generally to electromagnetic processing, and more particularly, the present invention relates to wideband signal processing.

BACKGROUND OF THE INVENTION

Electromagnetic waves and signals (hereinafter "waves") are utilized for many different purposes. For example, electromagnetic waves may be processed in order to convey intelligence, such as by attenuating and/or amplifying electromagnetic wave characteristics, for instance, as is seen when modulating amplitude, frequency or phase of an electrical current or radio frequency (RF) wave to transmit data. As another example, power may be conveyed along a wave in a controlled fashion by attenuating and/or amplifying electromagnetic wave characteristics, such as is seen when modulating voltage or current in a circuit. Moreover, the uses may be combined, such as when intelligence may be conveyed through a wave by processing power characteristics.

Electromagnetic wave characteristic processing may be accomplished through digital or analog techniques. Digital and analog attenuation and/or amplification may also be combined, that is, the same wave may be subject to various types of digital and/or analog attenuation and/or amplification within a system in order to accomplish desired tasks.

However, processing electromagnetic wave characteristics may be difficult. For example, choosing an appropriate technique or component to modify a wave characteristic may be difficult for a number of reasons. One of those reasons involves the type of wave to be modified. For example, low frequency waves, such as 60 Hz power waves, may need different processing techniques than high frequency waves such as 24 GHz radar waves. It is common practice therefore to use different components, with different characteristics, for different waves. For example, a switching semiconductor used within a computer for 60 Hz power waves has different power handling characteristics from a power semiconductor used in a 24 GHz radar system.

One attempt at standardizing techniques and components that has recently been used is to use characteristics of the wave as information to modify the wave. For example, by translating a wave into polar coordinates with amplitude and phase characteristics, either or both characteristics may be used and/or manipulated in such a manner so as to provide standardized techniques for various wave frequencies. However such attempts to date have been constrained by application difficulties. For example, attempts that use multiple amplifiers have suffered from difficulties attendant to amplifier combining. Specifically, components, such as transformers or quarter wave lines, are used to sum the output of the amplifiers in order to drive the load. These components add to the cost and size of the amplifier array.

Accordingly, it would be helpful to the art of electromagnetic processing to provide efficient, and at the same time, accurate techniques for the processing of electromagnetic waves.

SUMMARY OF THE INVENTION

Embodiments of the present invention include apparatus, methods and articles of manufacture for processing electromagnetic waves and signals. In one embodiment, an apparatus for electromagnetic processing is provided comprising a modulator for generating one or more elements representative of an input signal; a divider controlled by the one or more elements and receiving an electromagnetic wave to generate a modified signal; a comparator for comparing the modified signal to a reference signal and for generating a processed signal based upon the comparison; and a channel number calculator for selecting a channel for the processed signal, wherein the input signal incorporates the channel selection.

In another embodiment, a method of wideband processing a phase component signal is provided comprising generating one or more elements representative of an input signal; diving an electromagnetic wave based on the one or more elements to generate a modified signal; comparing the modified signal to a reference signal; and generating a processed signal based upon the comparison.

DETAILED DESCRIPTION OF THE INVENTION

Embodiments of the present invention include apparatus, methods and articles of manufacture for processing electromagnetic waves and signals. For illustration purposes, an exemplary embodiment comprises a wideband modulator adapted for processing electromagnetic waves and signals. The wideband modulator as disclosed herein may be implemented in a wide range of applications, such as, for example, a transmitter, receiver, transducer, etc. For purposes of illustration, an exemplary transmitter is disclosed in FIG. 1 in which is incorporated a wideband modulator in accordance with an embodiment of the present invention.

Figure 1:
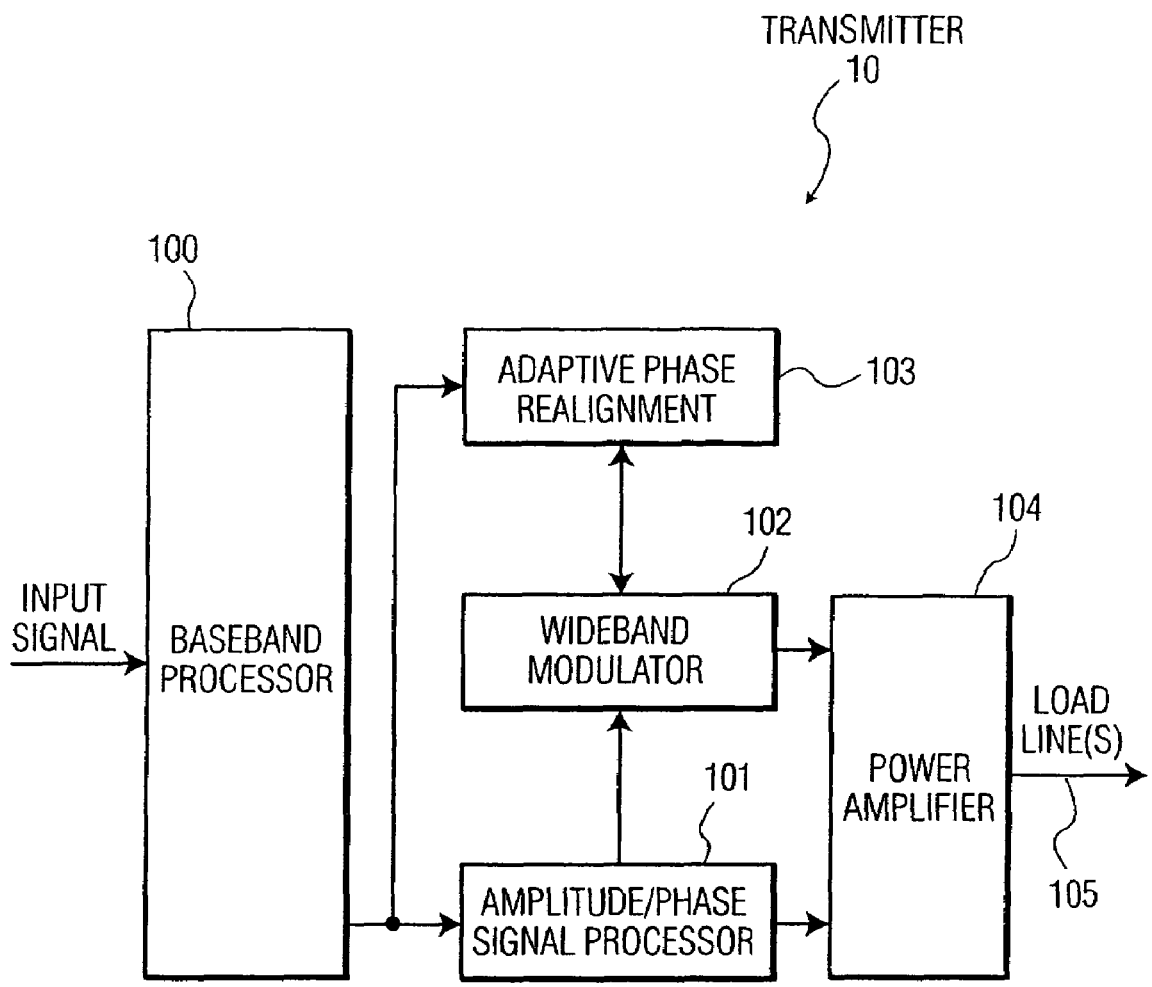
FIG. 1 is a block diagram illustrating an exemplary transmitter.

The exemplary transmitter 10 illustrated in FIG. 1 may include, for example, a baseband processor 100 adapted for receiving an input signal, an amplitude/phase signal processor 101, wideband modulator 102, adaptive phase realignment component 103, power amplifier 104 and one or more load lines 105 connected to an antenna. The details of transmitter 10 and its various components are described in more detail below.

The term "signal" as is used herein should be broadly construed to include any manner of conveying data from one place to another, such as, for example, an electric current or electromagnetic field, including without limitation, a direct current that is switched on and off or an alternating-current or electromagnetic carrier that contains one or more data streams. Data, for example, may be superimposed on a carrier current or wave by means of modulation, which may be accomplished in analog or digital form. The term "data" as used herein should also be broadly construed to comprise any type of intelligence or other information, such as, for example and without limitation, audio, such as voice, text and/or video, etc.

As illustrated in FIG. 1, the baseband processor 100 may be a digital signal processor in this embodiment, such as a digital signal processor capable of generating a power control signal and a data control signal in response to the input signal, which may be, for example, a baseband signal. As described in more detail below, the electrical power may be regulated by the data control signal in order to generate an output signal for transmission that is an amplified version of the input signal.

The data control signal generated by baseband processor 100 in this embodiment comprises an electromagnetic wave that contains data derived from the input signal. The data control signal is passed from baseband processor 100 to amplitude/phase signal processor 101. In one embodiment, I,Q data is converted by baseband processor 100 into a polar signal to create an analog or digital data control signal that contains the amplitude wave characteristic of the input signal, $a^m$, and an electromagnetic signal that contains the phase wave characteristic of the input signal, $a^p$. For example, a rectangular to polar converter may be used to output polar coordinates in the form R, P(sin) and P(cos). The R coordinate represents the amplitude characteristic of the wave. The P(sin) and P(cos) coordinates represent the phase characteristic of the wave.

The amplitude and phase characteristics of the input signal may then be transmitted through separate paths to power amplifier 104. The amplitude characteristics of the original input signal may be modulated as a series of digital pulses comprising a digital word quantized into bits $B_0$ to $B_{n-1}$, with a Most Significant Bit ("MSB") to Least Significant Bit ("LSB"). The digital word may be of varying lengths in various embodiments.

Figure 2:
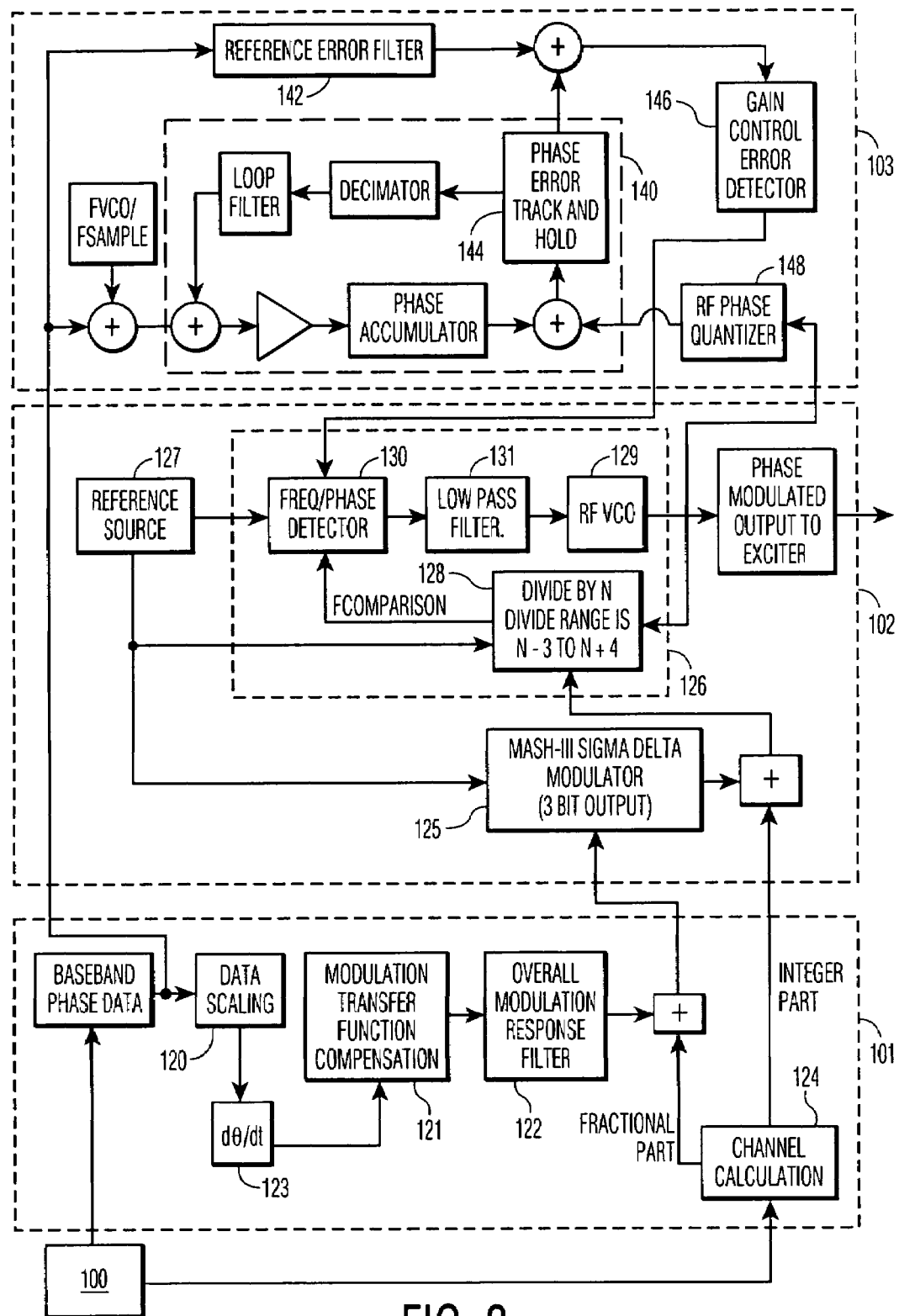
FIG. 2 is a block diagram illustrating an embodiment of a wideband modulator for use in the transmitter of FIG. 1.

The phase characteristic, in turn, may be processed separately and then applied to power amplifier 104. One exemplary manner for processing of the phase characteristic is illustrated in FIG. 2. FIG. 2 shows, in detail, exemplary embodiments for the signal processor 101, wideband modulator 102 and adaptive phase realignment 103 of FIG. 1.

In the present embodiment, the phase data from the input signal is first preferably passed through a data scaling processor 120, which scales amplitude of the data signal appropriately. The change in signal amplitude produced by data scaling processor 120 is calculated to compensate for any gain in the output signal from the wideband modulator 102. The scaling of the signal may be accomplished through any conventional means compatible with the data format, such as, for example, in a preferred embodiment the phase data signal is digital and scaling may be accomplished by digital processing. In this embodiment, wideband modulator 102 is inherently a frequency modulator, so that translation of data for frequency and phase representations of the data occurs via $d\theta/dt$ 123 shown in FIG. 2.

The phase component signal is then preferably passed through modulation compensation (equalization) filter 121, which is calculated to have a magnitude and phase response that is the inverse of the closed loop response of wideband modulator 102. As will be discussed below, in some instances, modulator 102 has an inherent design bandwidth to minimize noise in the signal. Limiting of the bandwidth in this manner, however, may cause a roll-off, that is, diminution, of the higher frequency components of the signal. Equalization filter 121 and overall modulation response filter 122 compensates for roll-off by increasing the gain of these higher frequency components, thus producing a more even (flattened) frequency response for the system and effectively extending the modulation bandwidth of wideband modulator 102. The equalization filter 121 is preferably implemented digitally, using a digital signal processor, although not limited thereto, and may be either a FIR (finite impulse response) or IIR (infinite frequency response) filter, as examples. The phase component data may also be passed through overall modulation response filter 122, which is calculated to set the overall passband response of wideband modulator 102 (e.g., 4 MHz). Overall modulation response filter 122, similar to equalization filter 121, may be an analog or digital FIR or IIR filter. Functionally, filters 121 and 122 may be combined into a signal filter where desired.

In the present embodiment, the baseband input signal may be modulated onto a carrier wave of a selected center frequency in wideband modulator 102. The center frequency about which a given signal is to be modulated is determined by a channel calculation, by which the carrier wave frequency (e.g., 1880 MHz) is divided by the frequency of the reference source to establish a channel for the signal.

In the present embodiment, the channel calculation yields a number that has an integer part and a fractional part. As shown in FIG. 2, channel calculator 124 received the channel number from baseband processor 100 and determines a selectable non-whole number by which the carrier wave of wideband modulator 102 is to be divided, allowing the selection of a channel in which the phase data signal is to be modulated. As an illustration of the channel calculation procedure, assuming a carrier wave frequency of 1880 MHz as an example, this number may be 23.5 to 24.5 as determined from the reference frequency. The fractional portion of this number is then combined with the data signal, which is passed to sigma delta modulator (SDM) 125 in wideband modulator 102. SDM 125 is used in connection with phase-locked loop (PLL) 126 to achieve wideband modulation of the input signal onto a carrier wave. SDM 125 serves to randomize and oversample the inputted phase data, with the average of multiple samples of the output being equal to the input. The SDM 125 in this embodiment operates in a manner so that inherent quantization noise from the digitizing process may be frequency shaped, so that at the desired frequencies, the noise is low.

Figure 3:
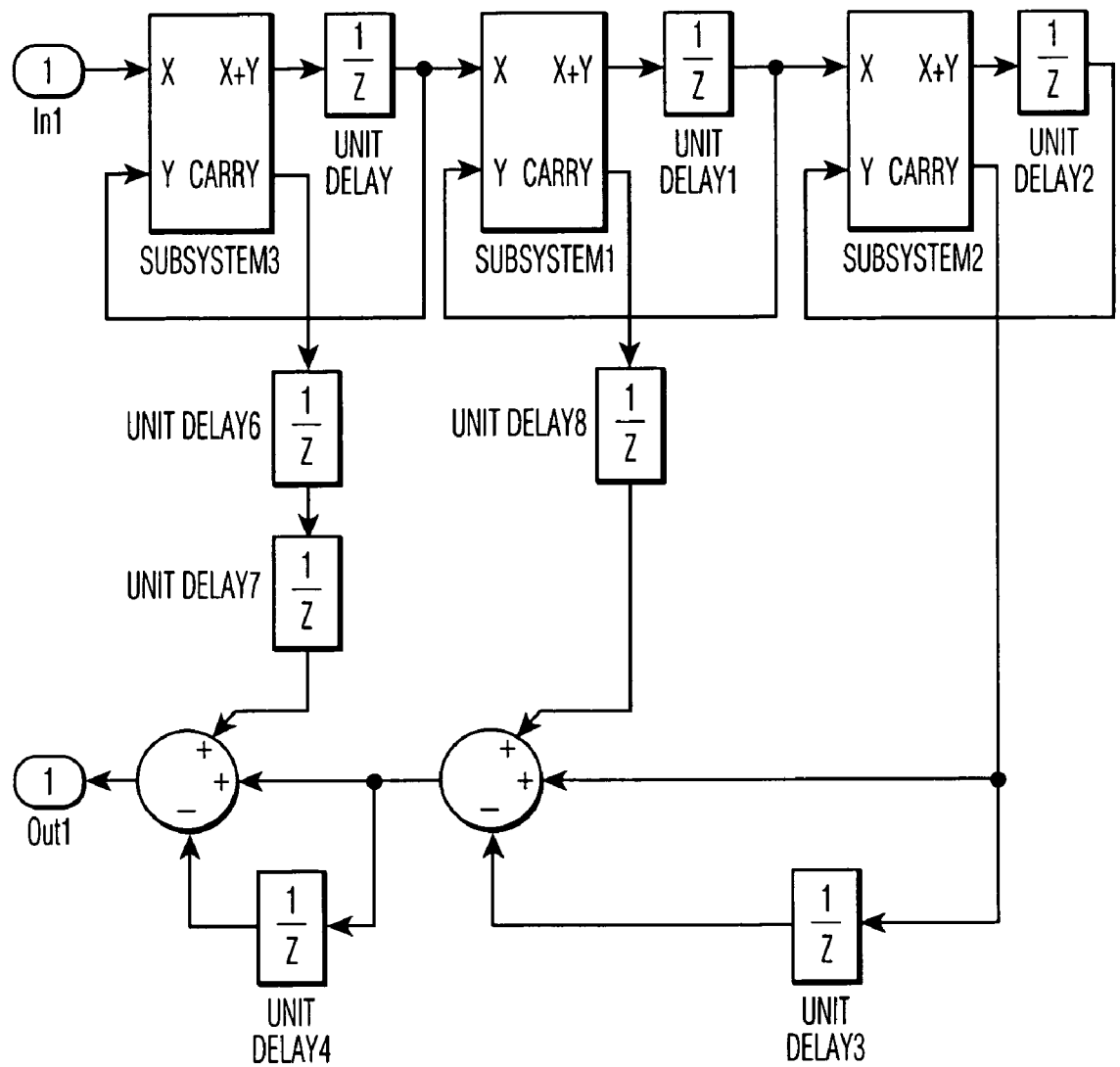
FIG. 3 is a schematic diagram illustrating an embodiment of a sigma-delta modulator used in a wideband modulator of FIG. 2.
Figure 4:
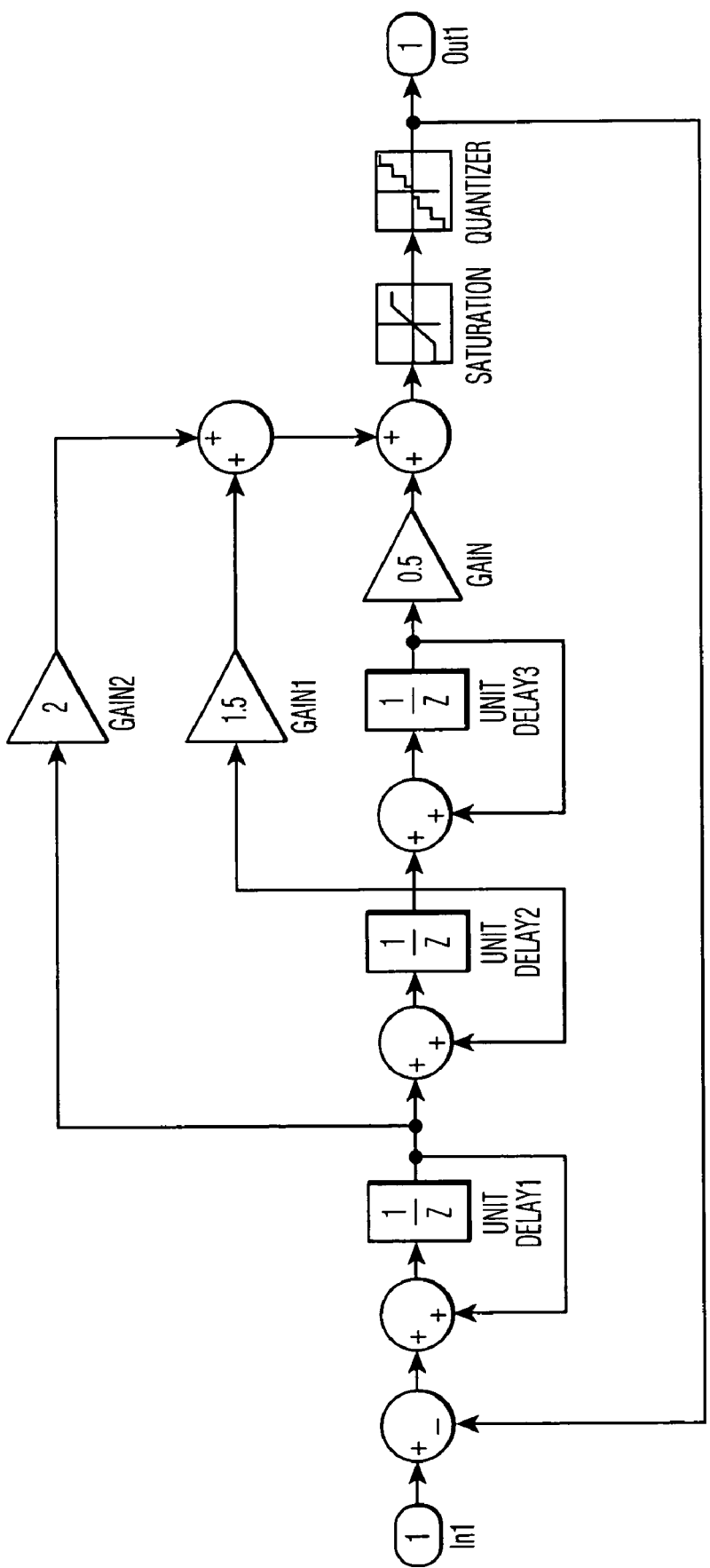
FIG. 4 is a schematic diagram illustrating another embodiment of a sigma-delta modulator used in a wideband modulator of FIG. 2

SDM 125 may comprise, for example, a series of adders/accumulators and feedback components for inputting the fractional phase/channel number data (which may be an analog or digital signal) and outputting a digitized series of integers that equal the fractional input. The SDM 125 is preferably configured in the present embodiment in such a manner that the input range is sufficient for phase modulation data as well as the fractional portion of the channel number. In one exemplary embodiment, SDM 125 is a three bit system, which is thus capable of producing eight different output numbers (e.g., −3, −2, −1, 0, 1, 2, 3, and 4), although as should be understood, in other embodiments SDM 125 may comprise any desired number of bits or elements. In the present embodiment, SDM 125 preferably produces four output integers for each sample of the input, yielding an oversampling rate of four times the input. Sampling of the input modulating data in SDM 125 in this manner may introduce noise on the input modulating signal. Any such noise may be filtered by low-pass loop filter 131 in PLL 126. FIGS. 3 and 4 illustrate two exemplary circuit topologies for the SDM 125. FIG. 3 illustrates a MASH III topology and FIG. 4 illustrates a $3^{rd}$ Order Loop topology. As should be understood, however, other suitable circuit topologies may also be utilized for the SDM 125 where desired.

The output of SDM 125 in the present embodiment is then combined with the integer portion of the channel number received from channel calculator 124. In the example discussed herein, the combination would produce a number from 20 to 28. The combination of the fractional and integer portions of the channel number is input to divider 128 in the present embodiment and used to lock PLL 126 to the desired RF carrier.

The PLL 126 in the present embodiment is preferably used to modulate a wave signal synthesized by an RF carrier wave signal source, such as carrier wave source 129, using the phase portion of the input signal. Carrier wave source 129 may be any source of electromagnetic waves that is capable for producing a carrier wave, such as a radio frequency voltage-controlled oscillator (VCO).

As shown in FIG. 2, in the present embodiment, the frequency of reference source 127 (or a division thereof by some number) is compared with the output frequency of carrier wave source 129, divided by the series of numbers received by divider 128 from SDM 125 and channel calculator 124. Reference source 127 may comprise a VCO of a constant or substantially constant frequency or may be derived from a source at another frequency.

As shown in FIG. 2, phase-frequency detector (PFD) 130 is used to compare the relative phases of the two signals and then outputs a signal that is proportional to the difference (phase shift) between them. This output signal is utilized to adjust the frequency of carrier wave source 129, so that the phase difference measured at PFD 130 is substantially close and preferably equal to zero. Hence, the phase of the signal is locked by the feedback loop to prevent unwanted drift of the signal phase, due to variations (i.e., distortion) in the phase and frequency of carrier wave source 129.

As illustrated in FIG. 2, the feedback signal from carrier wave source 129 is passed through divider 128, with the division ratio of the divider controlled by the series of numbers representing the phase component information received from SDM 125 and the channel information received from channel calculator 124. The resulting signal is passed to PFD 130, where it is compared with the signal from reference source 127, as noted above. This combined signal is passed through low-pass loop filter 131, and combined with the carrier wave signal of carrier wave source 129.

In the present embodiment, SDM 125 is being utilized to perform wideband modulation of the phase data input to SDM 125. Since the phase data input to SDM 125 is not constant, synchronizing SDM 125 to the output of divider 128 may introduce a frequency offset that is dependent on the modulation signal. Accordingly, it may be desired in certain embodiments that SDM 125 and divider 128 be synchronized by reference source 127. For example, buffering may be used between the output of SDM 125 and the input of divider 128, so that divider 128 may complete the divide count before updating with a new series of sample numbers.

As shown in FIG. 1, adaptive phase realignment component 103 may also be used to dynamically adjust the PLL response, to ensure that the equalization filter 121 and the closed loop response of the PLL 126 are closely matched. Adaptive phase realignment component 103 preferably measures the output phase of wideband modulator 102 and compares it to a theoretically perfect version that is derived from the baseband input data and the center frequency information received from channel calculator 124. The result of this comparison is used to adjust the loop gain of PLL 126 in wideband modulator 102. This feedback system operates to minimize the error in the transmitted signal. Adaptive phase realignment component 103 preferably operates while the transmitter is in service and reduces the need for manual calibration of the system.

An exemplary embodiment of adaptive phase realignment component 103 is illustrated in detail in FIG. 2. As should be understood, other suitable embodiments for the adaptive phase realignment 103 may also be utilized where desired. The adaptive phase realignment component 103 as illustrated in FIG. 2 may include, for example, a digital phase lock loop (DPLL) 140, a reference error filter 142, a carrier phase detector/track & hold 144, a gain-error detector 146 and a RF phase quantizer 148.

DPLL 140 operates to align the ideal phase to real RF phase by removing any constant phase offset, $\Phi$, and random drift, $\omega_{drift}$, due to the delays through SDM and RF quantized demodulation process.

$$RF\_VCO\_Out = \cos(\omega_c t + K_{tot}(1+\delta)d_n \int g(t)dt + \omega_{drift} t + \Phi)$$

Reference error filter 142 operates to produce a reference phase-error waveform from estimated loop filter transfer function. This reference error signal serves as a basis function for the measured true phase error. By multiplying the true phase error signal with the reference error signal, the polarity of the PLL gain error preferably matches the polarity of the automatic calibration feedback output. In addition, the average of the automatic calibration feedback output is preferably proportional to the amplitude of the PLL gain error (regardless of the polarity of the phase information signal).

Carrier phase detector/track & hold 144 operates to provide for direct comparison of digitally summed carrier and phase (ideal) to sampled VCO RF true phase output. The carrier phase detector/track & hold 144 removes phase ambiguity, such as a 2p-radian phase ambiguity as an example, and provides phase/frequency detection.

Gain-error detector 146 operates to produce the estimated deltas of the PLL gain error and provides a correction signal to the PLL frequency phase detector to adjust the loop gain.

RF phase quantizer 148 is used to sample the RF carrier to extract the baseband phase information to retrieve the modulating signal. This function is realized using an A/D converter as an example.

Returning now to FIG. 1, the processed wave output from wideband modulator 102 preferably has a constant envelope, i.e., it has no amplitude variations, yet it has phase characteristics of the original input wave. This output wave may then be sent where desired, such as to power amplifier 104, which may comprise any of a variety of suitable types of amplifier components. In one exemplary embodiment, power amplifier 104 is adapted to act as a current source when it is appropriately regulated by the digital word output from the amplitude component. The amplitude portion of the input signal is separately passed from amplitude/phase signal processor 101 to power amplifier 104 and may be used to actuate individual segments within power amplifier 104, to amplify or attenuate the phase modulated carrier signal in relation to the original input signal. This produces an output current from power amplifier 104 that represents an amplified or attenuated carrier wave containing the intelligence from the input signal.

In some embodiments, for example, with certain transmitter, receiver, and transceiver embodiments, the devices may be specialized for particular input signals, carrier waves and output signals, e.g. various types of cell phones, such as CDMA, CDMA2000, W-CDMA, GSM, TDMA, as well as various other types of devices, both wired and wireless, e.g. Bluetooth, 802.11a, -b, -g, radar, 1×RTT, radios, GPRS, computers and computer or non-computer communication devices, handheld devices, etc. Among the modulation schemes supported by the various embodiments include, for example, GMSK, which is used in GSM; GFSK, which is used in DECT & Bluetooth; 8-PSK, which is used in EDGE; OQPSK & HPSK, which are used in IS-2000; p/4 DQPSK, which is used in TDMA; and OFDM, which is used in 802.11.

Embodiments may utilize both analog and digital components, where desired, insofar as these embodiments manipulate waves and signals requiring both. For example, cell phone embodiments may utilize both analog and digital components. Various types of system architectures may also be utilized for constructing the embodiments. For example, embodiments or various components may be provided on a semiconductor device where desired, such as an integrated circuit or an application-specific integrated circuit composition; some examples include silicon (Si), silicon germanium (SiGe) or gallium arsenide (GaAs) substrates.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. One of ordinary skill in the art will accordingly appreciate that embodiments of the invention or various components and/or features thereof may be entirely comprised of hardware, software and/or may be a combination of software and hardware. Accordingly each of the blocks of the drawings, and combinations of blocks of the drawings, may be embodied in many different ways, as is well known to those of skill in the art. Accordingly, the foregoing description is by way of example only, and not limiting. The invention is limited only as defined in the following claims and equivalents thereto.

What is claimed is:

1. A method of wideband processing of a phase component signal comprising:
   preprocessing the phase component signal, the preprocessing comprising scaling to compensate for any gain in the phase component signal;
   performing a channel calculation resulting in at least two channel calculation components;
   combining a first of the channel calculation components with the preprocessed phase component signal to generate a combined signal;
   processing the combined signal to generate one or more elements representative of said phase component signal;
   dividing an electromagnetic carrier wave by a sum of said one or more elements and a second of the channel calculation components to generate a modified signal;
   comparing said modified signal to a reference signal;
   generating a processed signal based upon said comparison;
   compensating for error detected in the modified signal; and
   combining said processed signal with said electromagnetic carrier wave to produce a phase modulated signal.

2. The method of claim 1, wherein said channel calculation results in a number and wherein said first channel calculation component comprises any fractional part of said number and said second channel component comprises any integer part of said number and wherein the combination of the fractional part and the integer part is used to lock a phase locked loop to a desired frequency.

3. The method of claim 1, wherein said preprocessing step comprises equalization filtering to compensate for roll-off by increasing a gain for higher frequency components to produce a flattened frequency response and extend modulation bandwidth.

4. The method of claim 1, wherein said preprocessing step comprises modulation response filtering.

5. The method of claim 1, wherein said compensating step comprises deriving a reference electromagnetic wave from the phase component signal and adjusting said modified signal based on said reference electromagnetic wave.

6. An apparatus for wideband processing of a phase component signal comprising:
   means for preprocessing the phase component signal, the preprocessing means comprising a scaling processor to compensate for any gain in the phase component signal;
   means for performing a channel calculation resulting in at least two channel calculation components;
   means for combining a first of the channel calculation components with the preprocessed phase component signal to generate a combined signal;
   means for processing the combined signal to generate one or more elements representative of said phase component signal;
   means for dividing an electromagnetic carrier wave by said one or more elements representative of said phase component signal;
   means for dividing an electromagnetic carrier wave by a sum of said one or more elements and a second of the channel calculation components to generate a modified signal;
   means for comparing the modified signal to a reference signal;
   means for generating a processed signal based upon said comparison;
   means for compensating for error detected in said modified signal; and
   means for combining said processed signal with said electromagnetic carrier wave to produce a phase modulated signal.

7. The apparatus of claim 6, further comprising means for combining the second channel component with the one or more elements before the electromagnetic carrier wave is divided.

8. The apparatus of claim 7, wherein said channel calculation results in a number and wherein said first channel calculation component comprises any fractional part of said number and said second channel calculation component comprises any integer part of said number and wherein the combination of the fractional part and the integer part is used to lock a phase locked loop to a desired frequency.

9. The apparatus of claim 6, wherein said preprocessing means comprises one or more selected from the group consisting of a compensation filter to compensate for roll-off by increasing a gain for higher frequency components to produce a flattened frequency response and extend modulation bandwidth and a modulation response filter.

10. The apparatus of claim 6, wherein said compensating means comprises means for deriving a reference electromagnetic wave from the phase component signal and means for adjusting said modified signal based on said reference electromagnetic wave.

11. An apparatus for electromagnetic processing comprising:
    a scaling processor to compensate for any gain in a phase component signal;
    a channel number calculator for performing a channel calculation resulting in at least two channel calculation components;
    means for combining a first of said channel calculation components with the phase component signal to generate a combined signal;
    a modulator for processing the combined signal to generate one or more elements representative of said phase component signal;
    a divider for dividing an electromagnetic carrier wave by a sum of said one or more elements and a second of the calculation components to generate a modified signal;

a comparator for comparing said modified signal to a reference signal and for generating a processed signal based upon said comparison;

means for compensating for error detected in said modified signal; and means for combining said processed signal with said electromagnetic carrier wave to produce a phase modulated signal.

12. The apparatus of claim 11, further comprising means for combining the second channel calculation component with the one or more elements before the electromagnetic carrier wave is divided.

13. The apparatus of claim 11, wherein said channel number calculator is configured to perform a channel calculation that results in a number such that the first channel calculation component comprises any fractional part of said number and the second channel calculation component comprises any integer part of said number and wherein the combination of the fractional part and the integer part is used to lock a phase locked loop to a desired frequency.

14. The apparatus of claim 13, further comprising a compensation filter to compensate for roll-off by increasing the gain of higher frequency components to produce a flattened frequency response and extend modulation bandwidth and a modulation response filter.

15. The apparatus of claim 14, further comprising an adaptive phase realignment component to compensate for error detected in the modified signal.

16. The apparatus of claim 15, wherein said adaptive phase realignment component is in communication with said comparator and derives a reference electromagnetic wave from the phase component signal, wherein said modified signal is adjusted on detection of error based on said reference electromagnetic wave.

* * * * *